United States Patent
Suzuki et al.

(10) Patent No.: US 7,601,576 B2
(45) Date of Patent: Oct. 13, 2009

(54) METHOD FOR FABRICATING SEMICONDUCTOR DEVICE

(75) Inventors: Rintaro Suzuki, Kawasaki (JP); Hiroshi Morioka, Kawasaki (JP); Masanori Terahara, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/287,340

(22) Filed: Nov. 28, 2005

(65) Prior Publication Data

US 2007/0048916 A1    Mar. 1, 2007

(30) Foreign Application Priority Data

Aug. 23, 2005    (JP) .............................. 2005-241248

(51) Int. Cl.
 *H01L 21/336* (2006.01)
 *H01L 21/8234* (2006.01)
 *H01L 21/8238* (2006.01)
 *H01L 21/76* (2006.01)

(52) U.S. Cl. .................. 438/197; 438/424; 438/221; 438/296

(58) Field of Classification Search .............. 438/197, 438/218, 294, 424, 221, 219, 296, 427, 207
See application file for complete search history.

(56) References Cited

U.S. PATENT DOCUMENTS

| | | | | |
|---|---|---|---|---|
| 5,506,168 A * | 4/1996 | Morita et al. | ............... | 438/424 |
| 5,521,422 A | 5/1996 | Mandelman et al. | | |
| 5,677,233 A | 10/1997 | Abiko | | |
| 5,712,185 A * | 1/1998 | Tsai et al. | ............... | 438/424 |
| 5,960,297 A | 9/1999 | Saki | | |
| 6,093,619 A * | 7/2000 | Huang et al. | ............... | 438/400 |
| 6,417,047 B1 * | 7/2002 | Isobe | ............... | 438/258 |
| 6,555,427 B1 * | 4/2003 | Shimizu et al. | ............... | 438/238 |
| 6,828,648 B2 * | 12/2004 | Koido et al. | ............... | 257/510 |
| 2004/0092082 A1 | 5/2004 | Terahara et al. | | |
| 2005/0101143 A1 | 5/2005 | Lee et al. | | |
| 2005/0285509 A1 * | 12/2005 | Funamoto et al. | ........... | 313/504 |
| 2006/0105578 A1 * | 5/2006 | Hong et al. | ............... | 438/723 |

FOREIGN PATENT DOCUMENTS

| | | |
|---|---|---|
| JP | 9-181158 A | 7/1997 |
| JP | 11-145275 | 5/1999 |
| JP | 11-145275 A | 5/1999 |
| JP | 2004-152919 A | 5/2004 |
| KR | 10-2004-0061822 A | 7/2004 |

(Continued)

OTHER PUBLICATIONS

Office Action dated Nov. 20, 2006 issued in corresponding Korean Application No. 10-2005-0121581.
Chinese Office Action dated Nov. 9, 2007 (issuing date), issued in corresponding Chinese Patent Application No. 200510133849.7.
Chinese Office Action dated Aug. 1, 2008 (mailing date), issued in corresponding Chinese Patent Application No. 2005101338497.

* cited by examiner

*Primary Examiner*—Chuong A. Luu
(74) *Attorney, Agent, or Firm*—Westerman, Hattori, Daniels & Adrian LLP.

(57) ABSTRACT

The method for fabricating a semiconductor device comprises the steps of: forming on a silicon substrate 10 a hard mask 20 of a silicon oxide film 12, and a silicon nitride film 14 having a width smaller than a width of the silicon oxide film 12; etching the silicon substrate 10 with the hard mask 20 as the mask to form a trench 26 for defining an active region 24 in the silicon substrate 10; and forming a silicon oxide film 28 on the silicon substrate 10 with the trench 26 formed in.

18 Claims, 10 Drawing Sheets

METHOD FOR FABRICATING SEMICONDUCTOR DEVICE

CROSS-REFERENCE TO RELATED APPLICATIONS

This application is based upon and claims the benefit of priority from the prior Japanese Patent Application No. 2005-241248, filed on Aug. 23, 2005, the entire contents of which are incorporated herein by reference.

BACKGROUND OF THE INVENTION

The present invention relates to a method for fabricating a semiconductor device, more specifically a method for fabricating a semiconductor device including the step of forming a device isolation region.

As a process for forming a device isolation region defining an active region in a silicon substrate, STI (Shallow Trench Isolation) is known.

The conventional method for forming a device isolation region by the STI will be explained with reference to FIGS. 9A to 10C. FIGS. 9A to 10C are sectional views illustrating the conventional method for forming a device isolation region by STI.

First, a silicon oxide film 102 is formed as a pad oxide film on a silicon substrate 100 by, e.g., thermal oxidation, and then a silicon nitride film 104 is formed on the silicon oxide film 102 by, e.g., CVD.

Next, the silicon nitride film 104 and the silicon oxide film 102 are patterned by photolithography and dry etching (FIG. 9A).

Next, with the silicon nitride film 104 as the mask, the silicon substrate 100 is etched by, e.g., RIE. Thus, a trench 106 for the device isolation is formed in the silicon substrate 100 (FIG. 9B).

Next, a silicon oxide film 108 is deposited by, e.g., CVD on the entire surface of the silicon substrate 100 with the trench 106 formed in. Then, with the silicon nitride film 104 as the stopper, the silicon oxide film 108 is polished until the surface of the silicon nitride film 104 is exposed by, e.g., CMP to remove the silicon oxide film 108 on the silicon nitride film 104 (FIG. 9C).

Next, by wet etching using, e.g., hot phosphoric acid, the silicon nitride film 104 is removed (FIG. 10A).

Thus, the device isolation region 110 is formed of the silicon oxide film 108 buried in the trench 106. The device isolation region 110 defines an active region 112.

Then, ion implantation for forming a well and a channel in the silicon substrate 100 is conducted. Then, wet etching is conducted as the after-treatment, etc. following the ion implantation. This wet etching removes the silicon oxide film on the silicon substrate 100 in the active region 112, and the upper part of the silicon oxide film 108, and the substrate surface is planarized (FIG. 10B).

Next, a gate insulation film 114 of silicon oxide film is formed by, e.g., thermal oxidation on the silicon substrate 100 with the device isolation region 110 formed in.

Then, a polysilicon film is deposited on the gate insulation film 114 by, e.g., CVD and then patterned by photolithography and dry etching. Thus, a gate electrode 116 of the polysilicon film is formed, extended over the active region 112 and the device isolation region 110 (FIG. 10C).

However, the above-described conventional STI illustrated in FIGS. 9A to 10C has the following disadvantage which will be described below.

As described above, the wet etching conducted as the after-treatment, etc. for the ion implantation removes the upper part of the silicon oxide film 108 to thereby planarize the substrate surface. In the wet etching, the upper part of the silicon oxide film 108 is isotropically etched, and accordingly, as illustrated in FIG. 10B, a recess 118 is formed in the silicon oxide film 108 in the device isolation region 110 along the edge of the active region 112.

Resultantly, in the later step of forming the gate electrode 116, the gate electrode 116 is buried in the recess 118. The part of the gate electrode 116 which is buried in the recess 112 is a cause for the leak current due to the electric field concentration. The part buried in the recess 118 of the gate electrode 116 tends to be imperfectly patterned, which also causes the short circuit between the gate electrodes 116.

A technique for suppressing the generation of such defective configuration of the device isolation region around the edge of the active region is disclosed in, e.g., Japanese published unexamined patent application No. Hei 11-145275 (1999).

SUMMARY OF THE INVENTION

An object of the present invention is to provide a method for fabricating a semiconductor device which can surely prevent the generation of configurational defects of the device isolation region along the edge of the active region.

According to one aspect of the present invention, there is provided a method for fabricating a semiconductor device comprising the steps of: forming on a semiconductor substrate a mask film of a first insulation film whose etching characteristics are different from etching characteristics of the semiconductor substrate, and a second insulation film having a width smaller than a width of the first insulation film and having etching characteristics different from the etching characteristics of the first insulation film; etching the semiconductor substrate with the mask film as a mask to form a device isolation trench defining an active region; forming a third insulation film on the semiconductor substrate with the device isolation trench formed in; and removing the third insulation film on the second insulation film to form a device isolation film buried in the device isolation trench and having a projected part projected over a peripheral edge of the active region.

According to the present invention, on a semiconductor substrate, a mask film of a first insulation film having etching characteristics different from those of the semiconductor substrate and a second insulation film having etching characteristics different from those of the first insulation film is formed; the semiconductor substrate is etched with the mask film as the mask to form a device isolation trench for defining an active region in the semiconductor substrate; a third insulation film is formed on the semiconductor substrate with the device isolation trench formed in; and the third insulation film on the second insulation film is removed to form a device isolation film buried in the device isolation trench and having a projected part projected over the peripheral edge of the active region, whereby the device isolation film along the edge of the active region is protected by the projected part of the device isolation film to thereby surely prevent the generation of configurational defects of the device isolation region along the edge of the active region.

DETAILED DESCRIPTION OF THE INVENTION

Motivation of the Present Invention

Figure 1A:
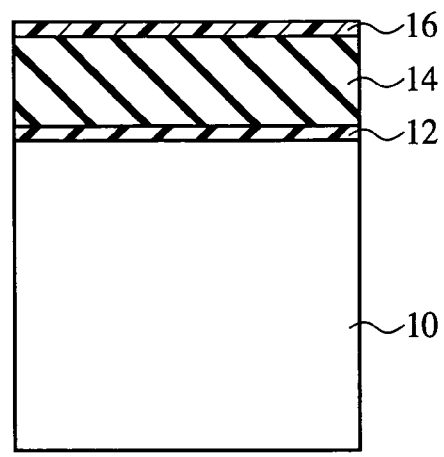
FIGS. 1A-1C, 2A-2C, 3A-3C and 4A-4B are sectional views of the semiconductor device in the steps of the method for fabricating the same according to a first embodiment of the present invention, which show the method.

In the technique disclosed in Japanese published unexamined patent application No. Hei 11-145275, in the STI illustrated in FIGS. 9A to 10C, the silicon nitride film 104 is isotropically etched to decrease after the step of forming the trench 106 and before the step of forming the silicon oxide film 108. The silicon nitride film 104 is decreased to thereby withdraw the periphery of the silicon nitride film 104 from the periphery of the silicon oxide film 102. Thus, in the technique, the silicon oxide film 108 is formed, projected over the periphery of the active region 112. Resultantly, the silicon oxide film 108 in the device isolation region 110 around the edge of the active region 112 is protected from the excessive etching.

In the technique disclosed in Japanese published unexamined patent application No. Hei 11-145275, the step of decreasing the silicon nitride film by dry etching or wet etching is conducted after the trench for the device isolation has been formed in the silicon substrate. The dry etching or the wet etching for decreasing the silicon nitride film is conducted with the side wall of the trench exposed. The technique, in which the etching is conducted with the side wall of the trench exposed, will have the following disadvantage.

When the silicon nitride film is decreased by dry etching, generally an etching gas containing a fluorocarbon-based gas is used as the etching gas. The fluorine radicals generated from such etching gas not only etches the silicon nitride film, but also damages the silicon substrate exposed on the side wall of the trench, which will cause the crystal defects.

On the other hand, when the silicon nitride film is decreased by wet etching, generally hot phosphoric acid is used as the etching liquid. However, the silicon content ratio of the silicon nitride film tends to vary, and the etching rate of the silicon nitride film largely varies in the etching. Accordingly, it is difficult to control the decrease amount of the silicon nitride film in the wet etching, and it will be difficult to sufficiently control the generation of the configurational defect in the device isolation region along the edge of the active region. Additionally, the etching using the hot phosphoric acid has a small selectivity ratio between the silicon nitride film and the silicon layer. In the wet etching as well, there will be a risk that the side wall of the trench may be etched, resultantly causing the disadvantages that the surface of the side wall is roughened, and crystal defects are generated, and other disadvantages.

A FIRST EMBODIMENT

The method for fabricating a semiconductor device according to a first embodiment of the present invention will be explained with reference to FIGS. 1A to 4B. FIGS. 1A to 4B are sectional views of the semiconductor device according to the present embodiment in the steps of the method for fabricating the same, which show the method.

First, a silicon oxide film 12 of, e.g., a 10 nm-thickness is formed as a pad oxide film on the surface of a silicon substrate 10 by, e.g., thermal oxidation.

Next, a silicon nitride film 14 of, e.g., a 100 nm-thickness is deposited on the silicon oxide film 12 by, e.g., low-pressure CVD.

Next, an anti-reflection film (BARC) 16 is formed on the silicon nitride film 14 (FIG. 1A).

Figure 1B:
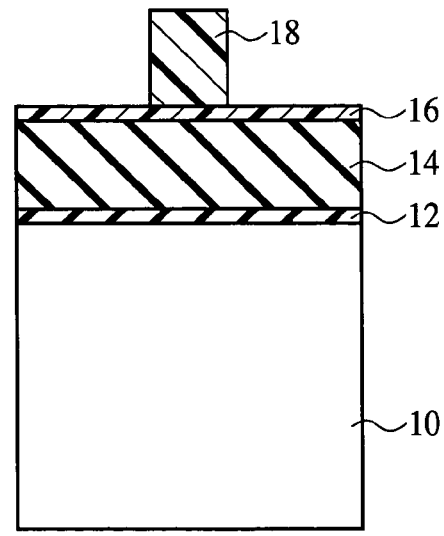

Next, a photoresist film 18 exposing a region for device isolation region to be formed in is formed on the anti-reflection film 16 by photolithography (FIG. 1B). The photoresist film 18 is formed in a smaller width than a region for an active region to be formed in, covering the region for the active region to be formed in.

Figure 1C:
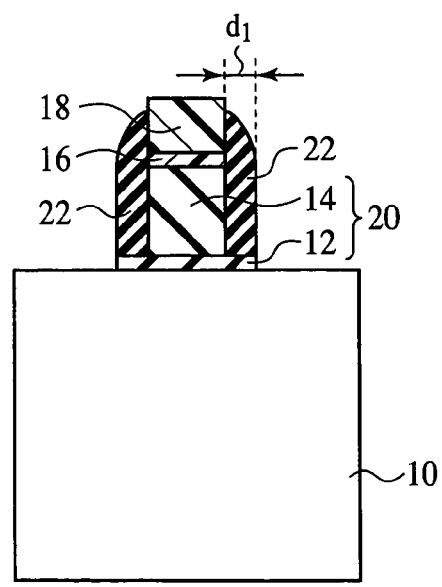

Then, with the photoresist film 18 as the mask, the anti-reflection film 16, silicon nitride film 14 and the silicon oxide film 12 are sequentially etched. Thus, a hard mask 20 of the silicon oxide film 12 and the silicon nitride film 14 is formed. The hard mask 20 is to be used as the mask for the trench etching as will be described later. Conditions for this etching are for depositing a reaction product 22 on the side wall of the silicon nitride film 14. Thus, the silicon oxide film 12 of the hard mask 20 is patterned into a width for determining the width of the active region. On the other hand, the silicon nitride film 14 is patterned into a width smaller than the width of the silicon oxide film 12 (FIG. 1C).

The etching conditions for the etching process for forming the hard mask 20 which is one major characteristics of the method for fabricating a semiconductor device according to the present embodiment will be detailed.

The etching for forming the hard mask 20 is conducted under conditions which make the etching selectivity ratio of the silicon nitride film 14 to the silicon oxide film 12 high. As the etching gas, an etching gas containing a fluorocarbon-based gas is used. The fluorocarbon-based gas can be $CH_aF_b$, $C_xF_y$, used in the usual semiconductor process, more specifically, $CF_4$, $CHF_3$, $CH_2F_2$, $CH_3F$, $C_3F_6$, $C_4F_8$, $C_4F_6$, $C_5F_8$ or others.

The etching process for forming the hard mask 20 is divided in the main etching for etching the anti-reflection film 16 and the silicon nitride film 14 down to the silicon oxide film 12 and the following overetching for etching the silicon oxide film 12.

In the main etching, the anti-reflection film 16 and the silicon nitride film 14 are sequentially dry etched with the photoresist film 18 as the mask.

Conditions for the main etching are, e.g., an ICP (Inductive Coupling Plasma) etching system, a 90 mTorr chamber internal pressure, a 800 W power of the ICP coil, a 400 V peak voltage of the RF bias, $CHF_3/O_2/Ar$ as the etching gas, and a 30/2/200 sccm flow rate of the etching gas, $CHF_3/O_2/Ar$.

In the main etching, when the silicon nitride film 14 is etched, and the silicon oxide film 12 is exposed, the reaction product 22 is abruptly increasingly deposited on the side wall of the silicon nitride film 14. The reaction product 22 is a fluorocarbon-based polymer produced by the reaction of the fluorocarbon-based gas.

Here, when the etching selectivity ratio of the silicon nitride film 14 to the silicon oxide film 12 is low, it is difficult to control the deposition amount of the reaction product 22. Accordingly, as described above, in the main etching, the silicon nitride film 14 is etched under conditions which make the etching selectivity ratio of the silicon nitride film 14 to the silicon oxide film 12 high.

For example, with the chamber internal pressure of the etching system below 40 mTorr, the etching selectivity ratio of the silicon nitride film 14 to the silicon oxide film 12 is often lowered. Accordingly, it is preferable that the chamber internal pressure for the main etching is above, e.g., 40 mTorr including 40 mTorr. With the chamber internal pressure is, e.g., above 200 mTorr, the density difference of the patterns formed by the etching is large unsuitably to make fine patterns. Thus, the chamber internal pressure for the main etching is preferably below, e.g., 200 mTorr including 200 mTorr.

For the main etching, oxygen gas is added to the etching gas containing a fluorocarbon-based gas. The addition of oxygen gas generates oxygen radicals in the etching. Oxygen radicals have the property of etching fluorocarbon-based polymer. Accordingly, the flow rate of the oxygen gas to be added, and the flow rate ratio of the fluorocarbon-based gas and the oxygen gas are controlled to thereby control the deposition amount of the reaction product 22 in the main etching.

The etching gas suitably contains an inert gas, such as argon gas, helium gas, xenon gas or others, in addition to a fluorocarbon-based gas and oxygen gas.

After the silicon nitride film 14 has been etched while the reaction product 22 has been deposited on the side wall thereof, as the overetching, the silicon oxide film 12 is continuously dry etched with the photoresist film 18 and the silicon nitride film 14 as the mask. The overetching is conducted at once together with the main etching in one and the same chamber of one and the same etching system as the main etching for etching the silicon nitride film 14 is conducted. Thus, the time required to form the hard mask 20 is shortened, and the cost of the fabrication process can be decreased.

Conditions for the overetching are, e.g., an ICP etching system, a 4 mTorr internal chamber pressure, a 800 W power of the ICP coil, a 410 V peak voltage of the RF bias, $CF_4$/$CH_2F_2$/He as the etching gas and a 10/40/200 sccm flow rate of the $CF_4$/$CH_2F_2$/He.

The overetching is conducted with the reaction product 22 deposited on the side wall of the silicon nitride film 14. The reaction product 22 acts as the mask, and the silicon oxide film 12 below the reaction product 22 is not etched. That is, in the overetching, the silicon oxide film 12 below the silicon nitride film 14 is masked by the silicon nitride film 14 and the silicon oxide film 12 below the reaction product 22 is also masked by the reaction product 22 to be thereby kept from the etching. Resultantly, the silicon oxide film 12 is patterned into a larger width than a width of the silicon nitride film 14.

As described above, one of the main characteristics of the method for fabricating a semiconductor device according to the present embodiment is that the hard mask 20 of the silicon oxide film 12 patterned in a width for determining a width of the active region, and the silicon nitride film 14 patterned in a width smaller than the width of the silicon oxide film 12 is formed as the mask for the trench etching.

In such hard mask 20, a distance d1 between the side edge of the silicon oxide film 12 and the side edge of the silicon nitride film 14 on the same side can be set at a prescribed value by controlling the deposition amount of the reaction product 22. The setting of the distance d1 will be described later.

Thus, the hard mask 20 of the silicon oxide film 12 patterned in a width determining a width of the active region and the silicon nitride film 14 patterned in a width smaller than the silicon oxide film 12 is formed on the silicon substrate 10, exposing the surface of the silicon substrate 10 in the region for the device isolation region to be formed in. On the side wall of the silicon nitride film 14, the reaction product 22 is deposited.

Figure 2A:
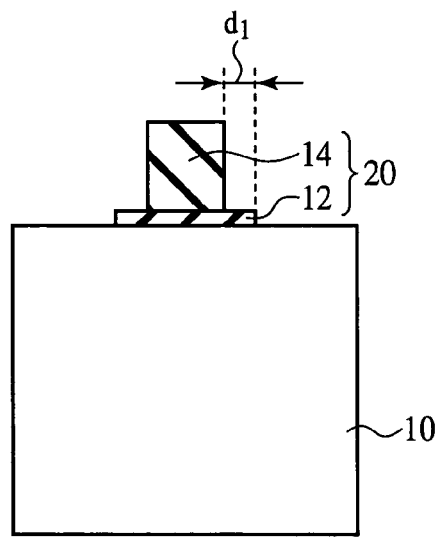

Then, the photoresist film 18 and the anti-reflection film 16 remaining on the silicon nitride film 14, and the reaction product 22 remaining on the side wall of the silicon nitride film 14 are removed by wet cleaning using, e.g., HF (hydrofluoric acid) and SPM (sulfuric acid/hydrogen peroxide mixture) liquid (FIG. 2A). The photoresist film 18, the anti-reflection film 16 and the reaction product 22 may be removed by wet cleaning using, e.g., HF and APM (ammonia/hydrogen peroxide mixture) liquid. The photoresist film 18, the anti-reflection film 16 and the reaction product 22 may be removed by ashing using, oxygen plasma.

For the following reason, the reaction product 22 deposited on the side wall of the silicon nitride film 14 is removed prior to the trench etching using the hard mask 20 as the mask. That is, the reaction product 22 of a fluorocarbon-based polymer has high hygroscopicity. Accordingly, when the trench etching is conducted with the hard mask 20 as the mask without removing the reaction product 22, the processed configuration of the trench is extremely unstable due to the influence of water, etc., and the reproducibility of the trench etching is lowered.

Figure 2B:
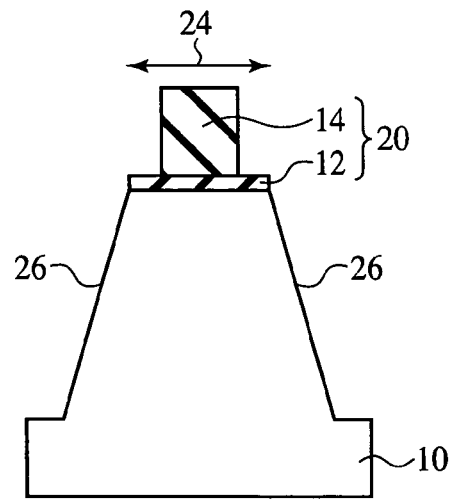

Then, the silicon substrate 10 is dry etched with the hard mask 20 of the silicon oxide film 12 and the silicon nitride film 14 as the mask. Thus, the trench 26 of the device isolation for defining the active region 24 is formed in the silicon substrate 10 (FIG. 2B). At this time, the width of the active region 24 is determined by the width of the silicon oxide film 12 of the hard mask 20.

On the surface of the silicon substrate 10 exposed after the hard mask 20 has been formed, a natural oxide film is often formed. In this case, etching for removing the natural oxide film is conducted prior to the main etching for forming the trench 26 in the silicon substrate 10. Conditions for removing the natural oxide film are, e.g., an ICP etching system, a 5 mTorr chamber internal pressure, a 200 W power of the ICP coil, a 400 V peak voltage of the RF bias, $CF_4$ etching gas and a 100 sccm flow rate of the $CF_4$ etching gas.

The main etching for forming the trench 26 in the silicon substrate 10 is conducted under etching conditions which make the etching selectivity ratio of the silicon substrate 10 to the silicon nitride film 14 and the silicon oxide film 12 high. For example, the etching gas is a mixed gas of at least one or more of hydrogen bromide (HBr) gas, chlorine ($Cl_2$) gas, hydrogen chloride (HCl) gas and hydrogen iodide (HI) gas, and oxygen gas. The addition of oxygen gas to the etching gas can make the etching selectivity ratio of the silicon substrate 10 to the silicon nitride film 14 and the silicon oxide film 12 high, whereby the peripheral edge of the silicon oxide film 12 is protected from being etched and retreating by the main etching to thereby suppress the variation of the difference between a width of the silicon oxide film 12 and a width of the silicon nitride film 14 of the hard mask 20.

For example, when the film thickness of the silicon oxide film 12 at the part where the reaction product 22 has been deposited is 10 nm, in order to form the trench 26 in a 300 nm-depth, the etching conditions are set so that the etching selectivity ratio of the silicon substrate 10 to the silicon oxide film 12 is above 30 including 30. When the etching for removing the natural oxide film is conducted before the main etching for forming the trench 26 is conducted, the etching conditions are set so that the effective etching selectivity ratio taking into account an amount of the silicon oxide film 12 to be removed by the etching for removing the natural oxide film is above 30 including 30.

Specific conditions for the main etching are, e.g., an ICP etching system, a 40 mTorr chamber internal pressure, a 1000 W power of the ICP coil, a 400 V peak voltage of the RF bias, HBr/$O_2$ etching gas and a 450/13 sccm flow rate of the HBr/$O_2$. In this case, it has been experimentally confirmed that the etching selectivity ratio of the silicon substrate 10 to the silicon oxide film 12 above 30 including 30 at the shoulder of the silicon oxide film 12 and above 50 including 50 at the flat region can be obtained.

It is preferable that the film thickness of the silicon oxide film 12 of the hard mask 20 is set at, e.g., above 5 nm including 5 nm. This is because when the film thickness of the silicon oxide film 12 is below, e.g., 5 nm, the silicon oxide film 12 cannot sufficiently functions as the mask for the trench etching. The film thickness of the silicon oxide film 12 is preferably set at below a distance d1 including the distance d1 between the side edge of the silicon oxide film 12 and the side edge of the silicon nitride film 14. This point will be detailed.

Next, the silicon substrate 10 with the trench 26 formed in is thermally oxidized to form a silicon oxide film (not illustrated) of, e.g. a 20 nm-thickness on the inside wall and the bottom surface of the trench 26.

Figure 2C:
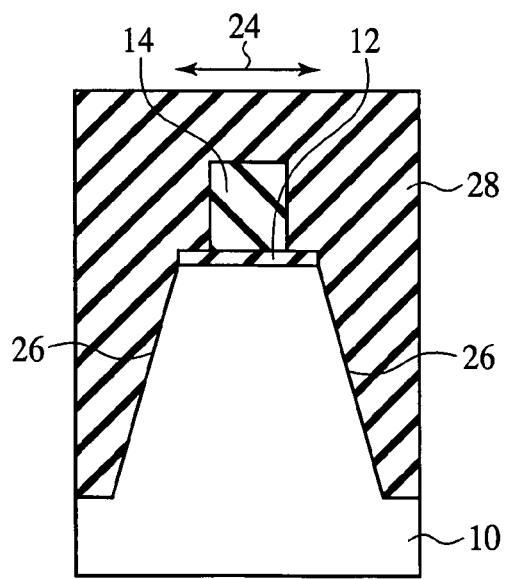

Next, a silicon oxide film 28 of, e.g., a 500 nm-thickness is deposited by, e.g., high density plasma CVD on the entire surface of the silicon substrate 10 with the trench 26 formed in. Thus, the silicon oxide film 28 is buried in the trench 26 (FIG. 2C).

Figure 3A:
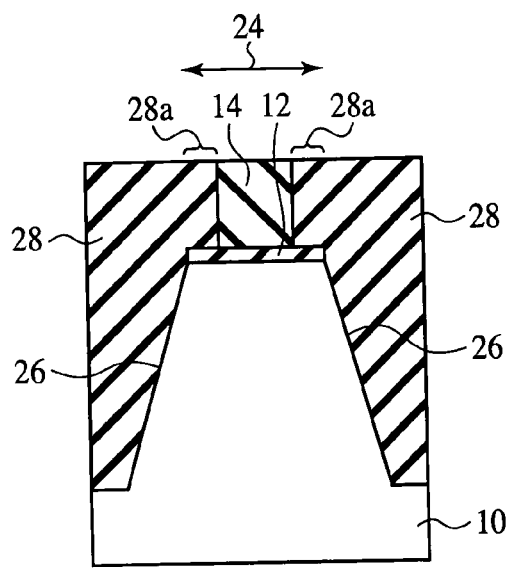

Next, the silicon oxide film 28 is polished by, e.g., CMP with the silicon nitride film 14 as the stopper until the surface of the silicon nitride film 14 is exposed to thereby remove the silicon oxide film 28 on the silicon nitride film 14 (FIG. 3A).

In the method for fabricating a semiconductor device according to the present embodiment, in the hard mask 20 used in the trench etching, the width of the silicon nitride film 14 is smaller than the width of the silicon oxide film 12. Accordingly, the silicon oxide film 28 has a projected part 28a over the peripheral edge of the active region 24 by a length corresponding to a distance d1 between the side edge of the silicon oxide film 12 and the side edge of the silicon nitride film 14.

Figure 3B:
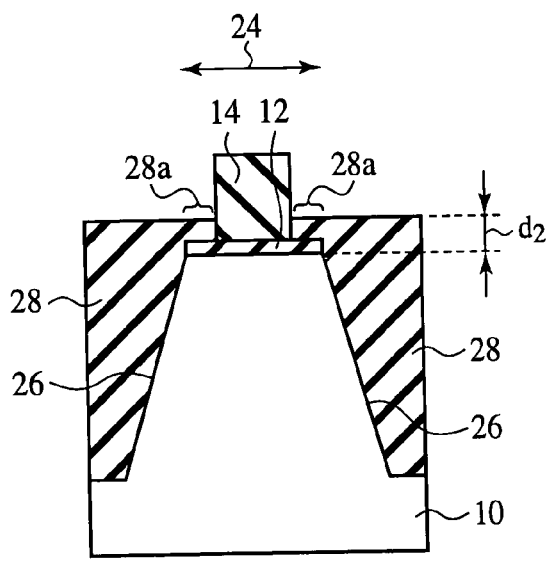

Then, the silicon oxide film 28 is etched to remove a part of the upper part of the silicon oxide film 28 (FIG. 3B). Thus, the surface of the silicon oxide film 28 is lowered to a height between the surface of the silicon nitride film 14 and the surface of the silicon substrate 10 in the active region 24.

Then, after the step of removing the silicon nitride film 14 and before the step of forming the gate insulation film 32 which will be described later, a series of wet etching is conducted as the after-treatment after ion implantation, etc. The series of wet etching further removes by a thickness d2 the upper part of the silicon oxide film 28 in the region where the trench 26 is formed. Over the peripheral part of the silicon substrate 10 in the active region 24, the series of wet etching removes the silicon oxide film (the residual part of the silicon oxide film 12 and the projected part 28a of the silicon oxide film 28) by a thickness d2 to expose the surface of the silicon substrate 10.

The silicon oxide film is thus removed by the thickness d2, whereby the substrate surface is planarized so as to form substantially no step between the surface of the silicon substrate 10 in the active region 10 and the surface of the silicon oxide film 28. Then, the thickness d2 is estimated in advance, and in the etching of the silicon oxide film 28 illustrated in FIG. 3B, a part of the upper part of the silicon oxide film 28 is removed so that the silicon oxide film can be left by a thickness corresponding to the thickness d2 as illustrated. That is, in the etching of the silicon oxide film 28 illustrated in FIG. 3B, a part of the upper part of the silicon oxide film 28 is removed until a height from the surface of the silicon substrate 10 in the active region 10 to the surface of the silicon oxide film 28 corresponds to a thickness of the silicon oxide film removed by the series of wet etching.

Figure 3C:
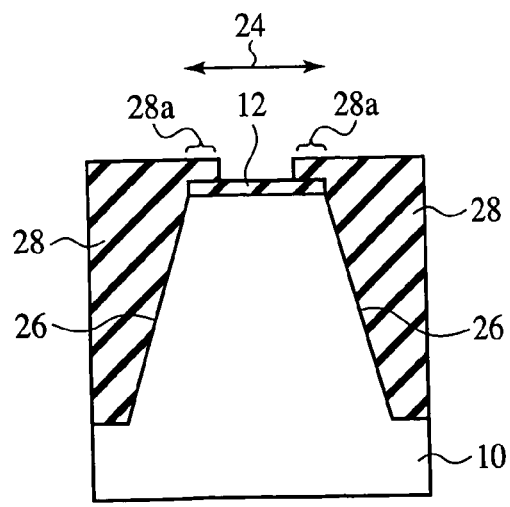

Then, the silicon nitride film 14 is removed by wet etching using, e.g., hot phosphoric acid (FIG. 3C).

After the silicon nitride film 14 has been removed, the exposed part of the silicon oxide film 12 is removed by wet etching using fluoric acid, etc. In this wet etching, the silicon oxide film 28 is etched and thinned.

Next, a sacrifice oxide film (not illustrated) is formed on the silicon substrate 10, and then ion implantation is suitably conducted for forming a well and channel in the silicon substrate 10.

Then, the sacrifice oxide film is removed by wet etching using fluoric acid, etc. to expose the surface of the silicon substrate 10 in the active region 24. In this wet etching, the silicon oxide film 28 is etched and thinned.

Figure 4A:
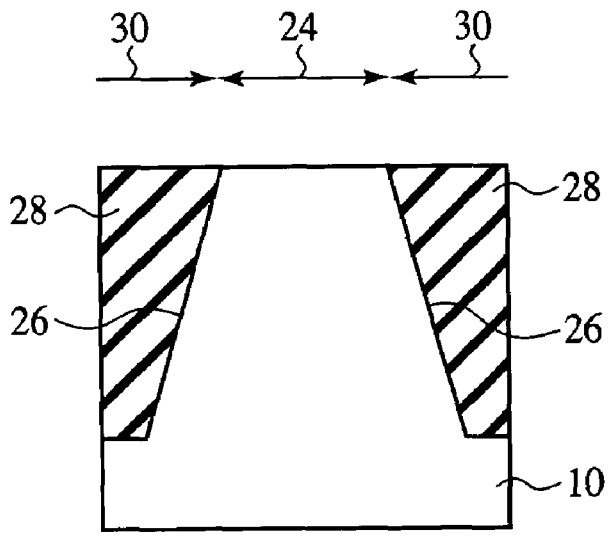

By the above-described series of wet etching conducted after the step of removing the silicon nitride film 14 and before the step of forming the gate insulation film 32, the silicon oxide film on the silicon substrate 10 in the active region 24, and the upper part of the silicon oxide film 28 is removed. Thus, the substrate surface is planarized so that the surface of the silicon oxide film 28 and the surface of the silicon substrate 10 in the active region are on substantially the same height (FIG. 4A). Thus, the device isolation region 30 with the device isolation film of the silicon oxide film 28 buried in is formed in the silicon substrate 10 by STI.

In the series of wet etching, the upper part of the silicon oxide film 28 is isotropically etched. In the method for fabricating a semiconductor device according to the present embodiment, the silicon oxide film 28 has the projected part 28a projected over the peripheral edge of the active region 24 by a length corresponding to a distance d1 between the side edge of the silicon oxide film 12 and the side edge of the silicon nitride film 14 of the hard mask 20. The projected part 28a of the silicon oxide film 28 prevents the isotropic etching of the silicon oxide film 28 from advancing to form a recess in the silicon oxide film 28 along the edge of the active region 24. Thus, the surface of the silicon substrate 10 with the device isolation region 30 formed in can be planarized while the device isolation region 30 along the edge of the active region 24 is being protected.

Here, the projected part 28a of the silicon oxide film 28 is projected over the peripheral edge of the active region 24 by a length corresponding to the distance d1 between the side edge of the silicon oxide film 12 and the side edge of the silicon nitride film 14. Accordingly, in forming the hard mask 20, the distance d1 between the side edge of the silicon oxide film 12 and the side edge of the silicon nitride film 14 is set equal to a thickness d2 of the silicon oxide film 28 to be removed by the series of wet etching. When the thickness d2 is, e.g., 15-20 nm, the distance d1 is also set at 15-20 nm. The distance d1 can be set equal to the thickness d2 by controlling the deposition amount of the reaction product 22 to be deposited on the side wall of the silicon nitride film 14 in the etching for forming the hard mask 20. Thus, the length of the projected part 28a of the silicon oxide film 28 projected over the peripheral edge of the active region 24 is controlled, whereby the formation of a recess in the silicon oxide film 28 along the edge of the active region 24 can be surely prevented. Accordingly, the side wall of the trench 26 can be surely prevented from being exposed.

With the film thickness of the silicon oxide film 12 being larger than a distance d1 between the side edge of the silicon oxide film 12 and the side edge of the silicon nitride film 14, it is difficult to sufficiently protect the device isolation region 30 along the edge of the active region 24 by the projected part 28a of the silicon oxide film 28. Accordingly, it is preferable to set the film thickness of the silicon oxide film 12 equal to or below the distance d1 between the side edge of the silicon oxide film 12 and the side edge of the silicon nitride film 14.

In the method for fabricating a semiconductor device according to the present embodiment, the silicon nitride film 14 patterned in a width smaller than a width of the silicon oxide film 12 is formed before the step of forming the trench 26, which is different form the technique described in Japanese published unexamined patent application No. Hei 11-145275. Accordingly, in the method for fabricating a semiconductor device according to the present embodiment, the side wall and the bottom surface of the trench 26 are free from being damaged by plasma processing and wet etching, as are in the technique described in Japanese published unexamined patent application No. Hei 11-145275.

Next, on the silicon substrate 10 with the device isolation region 30 formed in, the gate insulation film 30 of, e.g., a 5 nm-thickness silicon oxide film is formed by, e.g., thermal oxidation.

Next, a polysilicon film of, e.g. a 100 nm-thickness is formed on the gate insulation film 32 by, e.g., CVD.

Figure 4B:
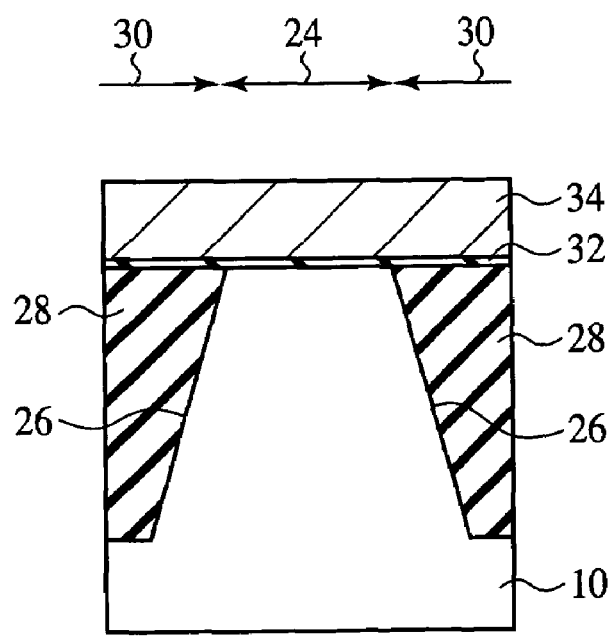

Next, the polysilicon film is patterned by photolithography and dry etching. Thus, the gate electrode 34 of the polysilicon film is formed, extended over the active region 24 and the device isolation region 30 (FIG. 4B).

In the method for fabricating a semiconductor device according to the present embodiment, the formation of a recess in the silicon oxide film 28 along the edge of the active region 24 is prevented. Accordingly, the generation of gate leak current in the edge of the active region 24 can be prevented while the short circuit between the gate electrodes 34 can be prevented.

Then, the source/drain regions, inter-layer insulation films, the plugs, interconnection layers, etc. are suitably formed, and the semiconductor device is completed.

As described above, according to the present embodiment, the hard mask 20 of the silicon oxide film 12 patterned in a width for determining a width of the active region 24 and the silicon nitride film 14 patterned in a width smaller than the width of the silicon oxide film 12 is formed as the mask for etching the trench 26, whereby the silicon oxide film 28 to be buried in the trench 26 is formed, having the projected part 28a projected over the peripheral edge of the active region 24. Accordingly, the device isolation region 30 along the edge of the active region 24 is protected by the projected part 28a of the silicon oxide film 28 to thereby surely prevent the generation of configurational defects of the device isolation region 30 along the edge of the active region.

Furthermore, according to the present embodiment, the silicon nitride film 14 patterned in a width smaller than a width of the silicon oxide film 12 is formed before the step of forming the trench 26, whereby the side wall and the bottom surface of the trench 26 are never damaged.

A SECOND EMBODIMENT

The method for fabricating a semiconductor device according to a second embodiment of the present invention will be explained with reference to FIGS. 5A to 8B. FIGS. 5A to 8B are sectional views of the semiconductor device according to the present embodiment in the steps of the method for fabricating the same, which show the method. The same members of the present embodiment as those of the method for fabricating a semiconductor device according to the first embodiment are represented by the same reference numbers not to repeat or to simplify their explanation.

One of the main characteristics of the method for fabricating a semiconductor device according to the present embodiment is that the silicon nitride film 14 is decreased by etching before the trench etching to form the hard mask 20 of the silicon oxide film 12 patterned in a width determining a width of the active region, and the silicon nitride film 14 patterned in a width smaller than the width of the silicon oxide film 12.

Figure 5A:
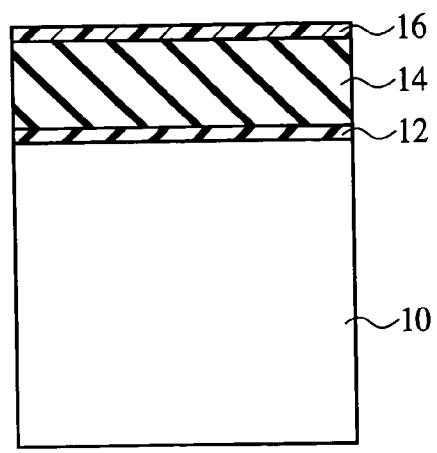
FIGS. 5A-5C, 6A-6C, 7A-7C and 8A-8B are sectional views of the semiconductor device in the steps of the method for fabricating the same according to a second embodiment of the present invention, which show the method.

In the same way as in the method for fabricating a semiconductor device according to the first embodiment, a silicon oxide film 12, a silicon nitride film 14 and an anti-reflection film 16 are sequentially formed on a silicon substrate 10 (FIG. 5A).

Figure 5B:
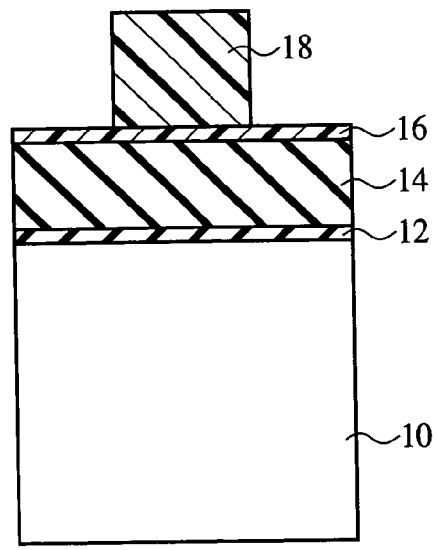

Next, a photoresist film 18 exposing a region for a device isolation region to be formed in and covering a region for an active region to be formed in is formed on the silicon nitride film (FIG. 5B).

Figure 5C:
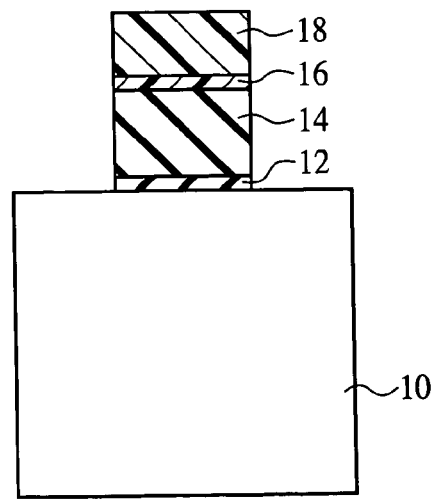

Then, the anti-reflection film 16, the silicon nitride film 14 and the silicon oxide film 12 are sequentially etched by dry etching with the photoresist film 18 as the mask. In the method for fabricating a semiconductor device according to the present embodiment, the silicon nitride film 14 and the silicon oxide film 12 are patterned into widths substantially equal to each other without using the etching conditions for causing the reaction product 22 to deposit as in the method for fabricating a semiconductor device according to the first embodiment (FIG. 5C).

Thus, the layered structure of the silicon oxide film 12 and the silicon nitride film 14 patterned in widths substantially equal to each other is formed on the silicon substrate 10, and the surface of the silicon substrate 10 in the region for the device isolation region to be formed in is exposed.

Next, the photoresist film 18 and the anti-reflection film 16 remaining on the silicon nitride film 14 are removed by, e.g., wet processing.

Figure 6A:
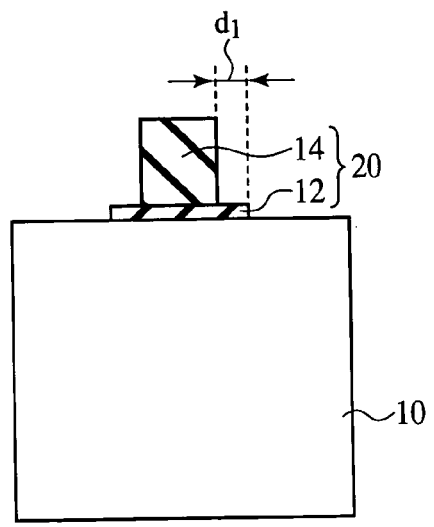

Next, the silicon nitride film 14 is etched by wet etching using, e.g., hot phosphoric acid to decease the silicon nitride film 14 (FIG. 6A). Thus, the width of the silicon nitride film 14 is made smaller than the width of the silicon oxide film 12. In place of the wet etching, the silicon nitride film 14 may be isotropically dry etched under conditions which make the etching selectivity ratio of the silicon nitride film 14 to the silicon oxide film 12 very high to thereby decrease the silicon nitride film 14. This dry etching can be chemical dry etching or others.

Thus, the hard mask 20 of the silicon oxide film 12 patterned in a width determining in a width of the active region and the silicon nitride film 14 patterned in a width smaller than the width of the silicon oxide film 12 is formed on the silicon substrate 10.

In the hard mask 20, a distance d1 between the side edge of the silicon oxide film 12 and the side edge of the silicon nitride film 14 on the same side is set as in the method for fabricating a semiconductor device according to the first embodiment.

The film thickness of the silicon oxide film 12 of the hard mask 20 is set at, e.g., above 5 nm including 5 nm as in the method for fabricating a semiconductor device according to the first embodiment. It is preferable to set a film thickness of the silicon oxide film 12 equal to or below the distance d1 between the side edge of the silicon oxide film 12 and the side edge of the silicon nitride film 14.

Figure 6B:
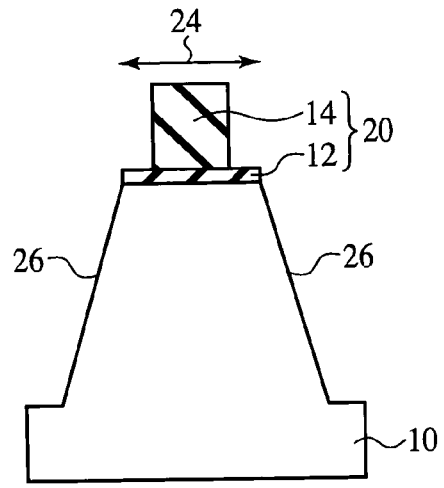

Then, with the hard mask 20 of the silicon oxide film 12 and the silicon nitride film 14 as the mask, the silicon substrate 10 is dry etched in the same way as in the method for fabricating a semiconductor device according to the first embodiment. Thus, the trench 26 for the device isolation defining the active region 24 is formed in the silicon substrate 10 (FIG. 6B). At this time, the width of the active region 24 is determined by a width of the silicon oxide film 12 of the hard mask 20.

Then, the silicon substrate 10 with the trench 26 formed in is thermally oxidized to thereby a silicon oxide film (not illustrated) of, e.g., a 20 nm-thickness on the inside wall and the bottom surface of the trench 26.

Figure 6C:
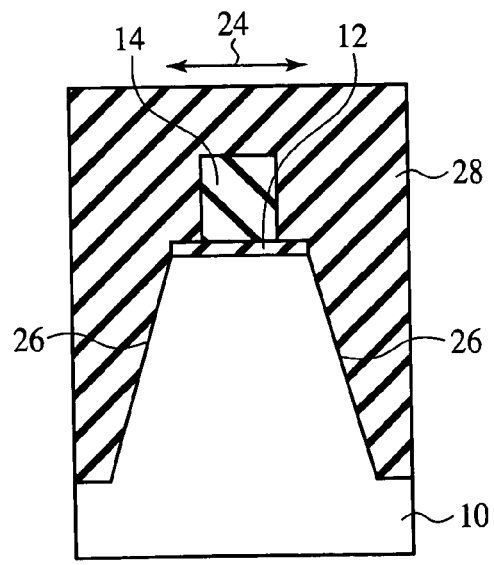

Next, a silicon oxide film 28 of, e.g., a 500 nm-thickness is deposited by, e.g., high density plasma CVD on the entire surface of the silicon substrate 10 with the trench 26 formed in. Thus, the trench 26 is filled with the silicon oxide film 28 (FIG. 6C).

Figure 7A:
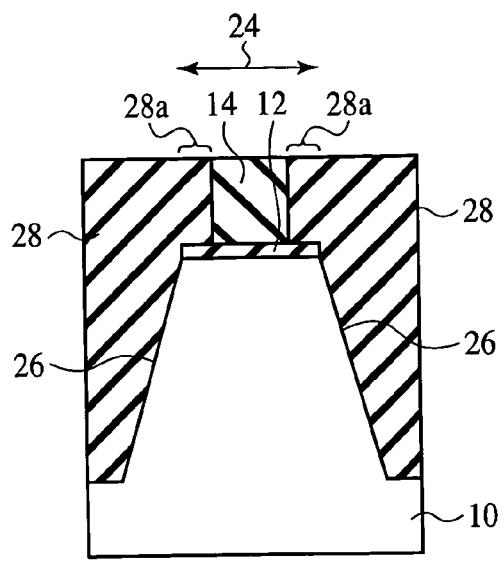

Then, silicon oxide film 28 is polished by, e.g., CMP with the silicon nitride film 14 as the stopper until the surface of the silicon nitride film 14 is exposed to remove the silicon oxide film 28 on the silicon nitride film 14 (FIG. 7A).

In the method for fabricating a semiconductor device according to the present embodiment, in the hard mask 20 used for the trench etching, the width of the silicon nitride film 14 is smaller than the width of the silicon oxide film 12, as is in the method for fabricating a semiconductor device according to the first embodiment. Accordingly, the silicon oxide film 28 has a projected part 28a which is projected over the peripheral edge of the active region 24 by a length corresponding to the distance d1 between the side edge of the silicon oxide film 12 and the side edge of the silicon nitride film 14.

Figure 7B:
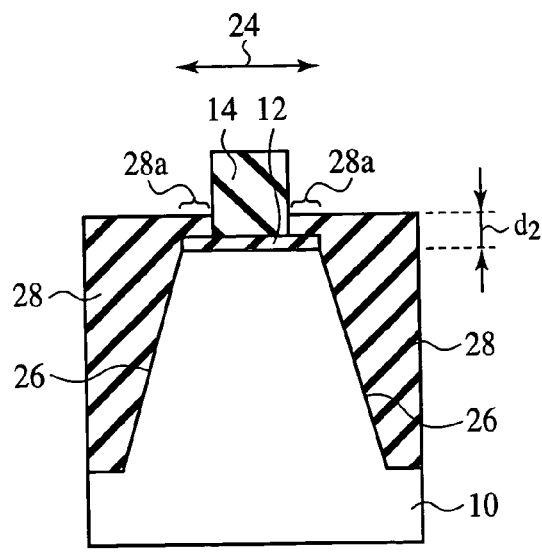

Next, the silicon oxide film 28 is etched to remove a part of the upper part of the silicon oxide film 28 (FIG. 7B). Thus, the surface of the silicon oxide film 28 is lowered to a height between the surface of the silicon nitride film 14 and the surface of the silicon substrate 10 in the active region 24. In the same way as in the method for fabricating a semiconductor device according to the first embodiment, a part of the upper part of the silicon oxide film 28 is removed to be left by a thickness d2.

Figure 7C:
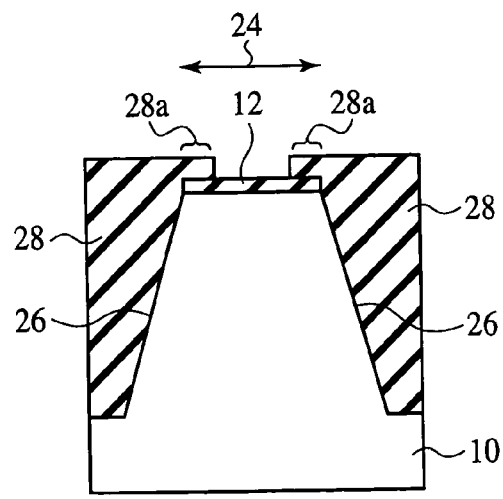

Next, the silicon nitride film 14 is removed by wet etching using, e.g., hot phosphoric acid (FIG. 7C).

After the silicon nitride film 14 has been removed, the exposed part of the silicon oxide film 12 is removed by wet etching using fluoric acid, etc. to expose the surface of the silicon substrate 10 in the active region 24. In this wet etching, the silicon oxide film 28 is etched and thinned.

Next, a sacrifice oxide film (not illustrated) is formed on the silicon substrate 10, and then ion implantation is suitably conducted to form a well and a channel in the silicon substrate 10.

Next, the sacrifice oxide film is removed by wet etching using fluoric acid, etc. to expose the surface of the silicon substrate 10 in the active region 24. In this wet etching, the silicon oxide film 28 is etched and thinned.

Figure 8A:
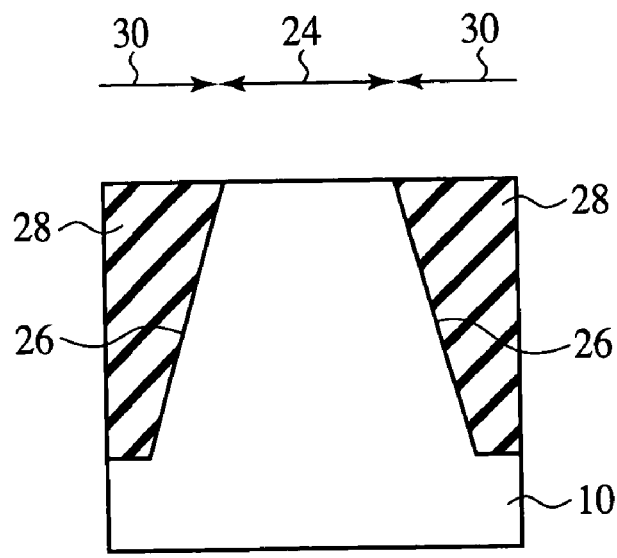
Figure 8B:
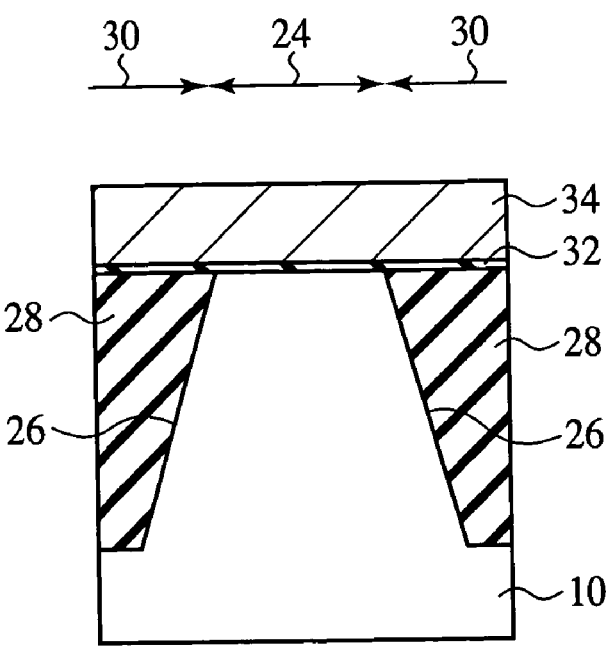
Figure 9A:
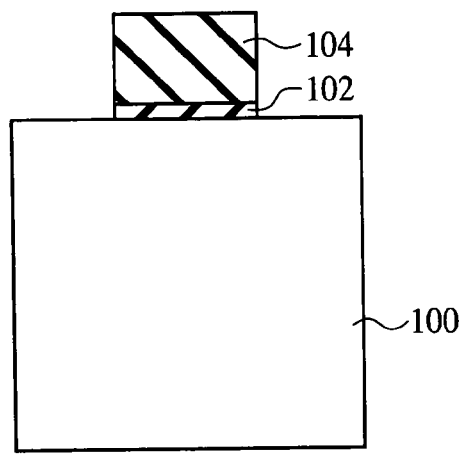
FIGS. 9A-9C and 10A-10C are sectional views illustrating the conventional method for forming a device isolation region by STI.
Figure 9B:
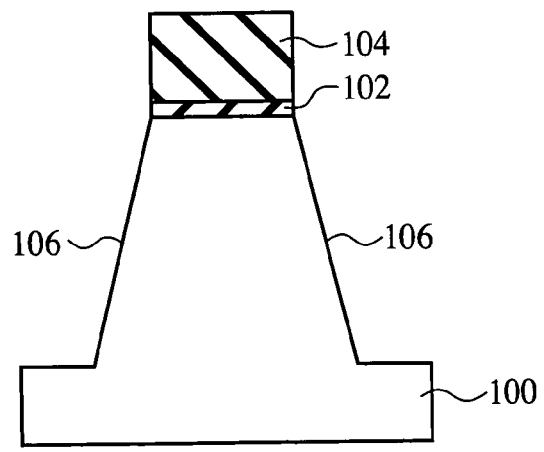
Figure 9C:
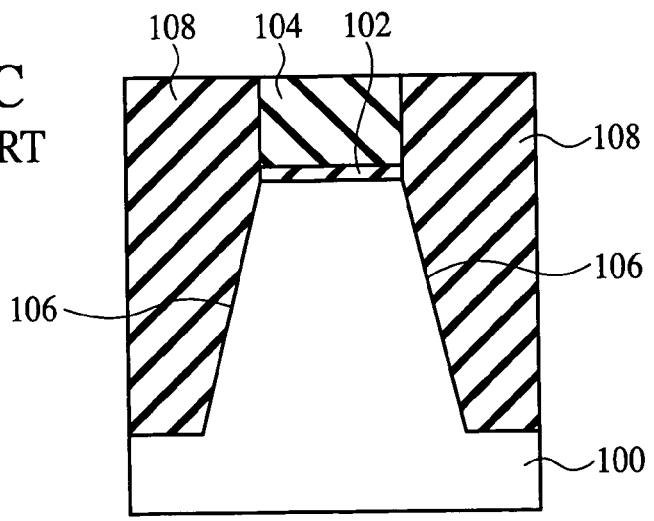
Figure 10A:
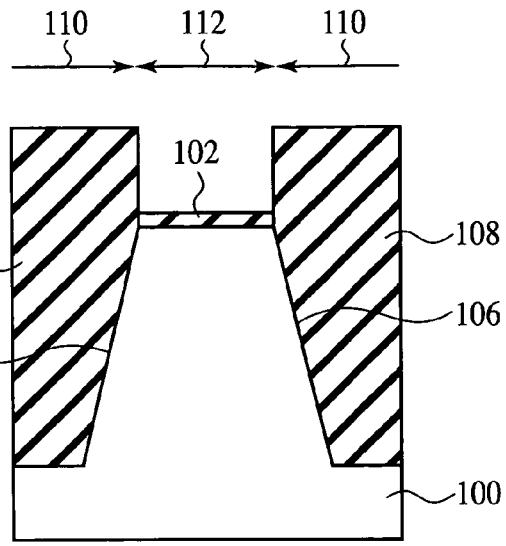
Figure 10B:
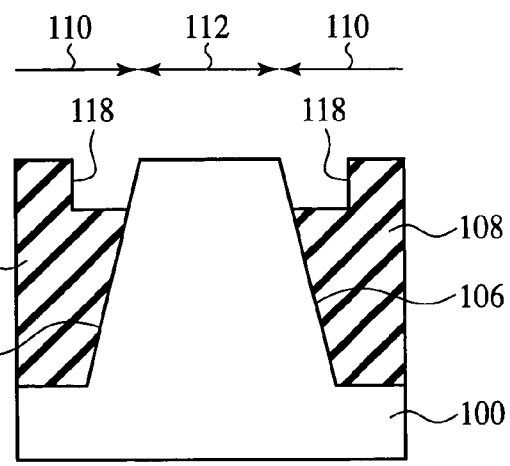
Figure 10C:
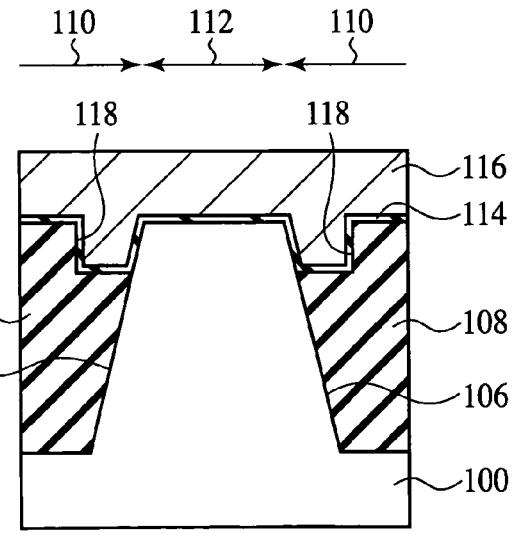

By the above-described series of wet etching conducted after the step of removing the silicon nitride film 14 and before the step of forming the gate insulation film 32, the silicon oxide film on the silicon substrate 10 in the active region 24, and the upper part of the silicon oxide film 28 is removed. Thus, the substrate surface is planarized so that the surface of the silicon oxide film 28 and the surface of the silicon substrate 10 in the active region are on substantially the same height (FIG. 8A). Thus, the device isolation region 30 with the device isolation film of the silicon oxide film 28 buried in is formed in the silicon substrate 10 by STI.

The series of wet etching isotropically etches the upper part of the silicon oxide film 28. In the method for fabricating a semiconductor device according to the present embodiment as well as the method for fabricating a semiconductor device according to the first embodiment, the silicon oxide film 28 has the projected part 28a projected over the peripheral edge of the active region 24 by a length corresponding to a distance d1 between the side edge of the silicon oxide film 12 and the side edge of the silicon nitride film 14 of the hard mask 20. The projected part 28a of the silicon oxide film 28 prevents the isotropic etching of the silicon oxide film 28 from advancing to form a recess in the silicon oxide film 28 along the edge of the active region 24. Thus, the surface of the silicon substrate 10 with the device isolation region 30 formed in can be planarized while the device isolation region 30 along the edge of the active region 24 is being protected.

Here, the projected part 28a of the silicon oxide film 28 is projected over the peripheral edge of the active region 24 by a length corresponding to the distance d1 between the side edge of the silicon oxide film 12 and the side edge of the silicon nitride film 14. Accordingly, when the hard mask 20 is formed, the distance d1 between the side edge of the silicon oxide film 12 and the side edge of the silicon nitride film 14 is set equal to a thickness d2 of the silicon oxide film 28 to be removed by the series of wet etching. For example, when the thickness d2 is 15-20 nm, the distance d1 is set also at 15-20 nm. The distance d1 can be set by suitably setting the etching conditions, such as the etching period of time, etc. for etching to decrease the silicon nitride film 14. Thus, the length of the projected part 28a of the silicon oxide film 28 projected over the peripheral edge of the active region 24 is controlled, whereby the formation of a recess in the silicon oxide film 28 along the edge of the active region 24 can be surely prevented. Accordingly, the side wall of the trench 26 can be surely prevented from being exposed.

In the method for fabricating a semiconductor device according to the present embodiment, the etching for decreasing the silicon nitride film 14 is conducted before the step of forming the trench 26, which is different form the technique described in Japanese published unexamined patent application No. Hei 11-145275. Accordingly, in the method for fabricating a semiconductor device according to the present embodiment, the side wall and the bottom surface of the trench 26 are free from being damaged by plasma processing and wet etching, as are in the technique described in Japanese published unexamined patent application No. Hei 11-145275.

Next, in the same way as in the method for fabricating a semiconductor device according to the first embodiment, a gate electrode 34 is formed on the silicon substrate 10 with the device isolation region 30 formed in, with the gate insulation film 32 formed therebetween.

In the method for fabricating a semiconductor device according to the present embodiment as well, the formation of a recess in the silicon oxide film 28 along the edge of the active region is prevented. Accordingly, the generation of gate leak current in the edge of the active region 24 can be prevented, and the short circuit between the gate electrodes 34 can be prevented.

Then, the source/drain regions, inter-layer insulation films, plugs, interconnection layers, etc. are suitably formed, and semiconductor device is completed.

As described above, according to the present embodiment, the hard mask 20 of the silicon oxide film 12 patterned in a width for determining a width of the active region 24 and the silicon nitride film 14 patterned in a width smaller than the width of the silicon oxide film 12 is formed as the mask for etching the trench 26, whereby the silicon oxide film 28 to be buried in the trench 26 is formed, having the projected part 28a projected over the peripheral edge of the active region 24. Accordingly, the device isolation region 30 along the edge of the active region 24 is protected by the projected part 28a of the silicon oxide film 28 to thereby surely prevent the generation of configurational defects of the device isolation region 30 along the edge of the active region.

Furthermore, according to the present embodiment, the etching for decreasing the silicon nitride film 14 is conducted before the step of forming the trench 26, whereby the side wall and the bottom surface of the trench 26 is kept from being damaged.

MODIFIED EMBODIMENTS

The present invention is not limited to the above-described embodiments and can cover other various modifications.

For example, in the above-described embodiments, the silicon oxide film 12 is formed as the pad oxide film. However, the pad oxide film is not essentially silicon oxide film. In place of the silicon oxide film 12, a silicon oxide film-based insulation film, such as silicon oxynitride film or others, whose etching characteristics are different from the etching characteristics of the silicon substrate 10 to allow the etching selectivity ratio to the silicon substrate 10 to be high.

In the above-described embodiments, the silicon nitride film 14 is formed as an insulation film forming the hard mask 20 and used as the stopper for the polish of the silicon oxide film 28 by CMP. However, this insulation film is not essentially silicon nitride film. In place of the silicon nitride film 14, an insulation film whose etching characteristics are different from those of the pad oxide film and allow the etching selectivity ratio to the pad oxide film to be high, and which can be used as the stopper for the polish by CMP can be formed. Specifically, in place of the silicon nitride film 14, silicon-rich silicon nitride film (SiRN film), silicon oxynitride film (SiON film), SiC film or others may be formed.

In the above-described embodiments, the silicon oxide film 28 is buried in the trench 26. The insulation film to be buried in the trench 26 is not essentially silicon oxide film. In place of silicon oxide film 28, another silicon oxide film-based insulation film, such as silicon oxynitride oxide film, or others, for example, may be buried in the trench 26.

In the above-described first embodiment, in forming the hard mask 20, the step of etching the silicon nitride film 14 and the step of etching the silicon oxide film 12 are conducted at once in one and the same chamber of one and the same etching system. However, it is not necessary to conduct these etching steps at once in one and the same chamber of one and the same etching system.

What is claimed is:

1. A method for fabricating a semiconductor device comprising the steps of:
    forming on a semiconductor substrate a mask film including a first insulation film whose etching characteristics are different from etching characteristics of the semiconductor substrate, and a second insulation film having a width smaller than a width of the first insulation film and having etching characteristics different from the etching characteristics of the first insulation film, the second insulation film being formed over the first insulation film;
    etching the semiconductor substrate with the mask film as a mask to form a device isolation trench defining an active region;
    forming a third insulation film on the semiconductor substrate with the device isolation trench formed in; and
    removing the third insulation film on the second insulation film to form a device isolation film buried in the device isolation trench and having a projected part composed of the third insulation film projected over a peripheral edge of the active region, the projected part covering the peripheral edge.

2. A method for fabricating a semiconductor device according to claim 1, further comprising after the step of forming the device isolation film, the steps of:
    removing the second insulation film; and
    forming a gate insulation film on the active region,
    a length of the projected part of the device isolation film projected over the peripheral edge of the active region being controlled lest the device isolation film should be removed by wet etching conducted between the step of removing the second insulation film and the step of forming the gate insulation film to thereby expose a side wall of the device isolation trench.

3. A method for fabricating a semiconductor device according to claim 2, further comprising after the step of forming the device isolation film and before the step of removing the second insulation film, the step of
    removing a part of a upper part of the device isolation film,
    in the step of removing the part of the upper part of the device isolation film, the part of the upper part of the device isolation film being removed so that the upper part of the device isolation film is removed by said wet etching to thereby planarize a surface of the semiconductor substrate.

4. A method for fabricating a semiconductor device according to claim 2, wherein
    a distance between a side edge of the first insulation film on one side and a side edge of the second insulation film on said one side in the mask film is equal to a thickness of the upper part of the device isolation film to be removed by said wet etching.

5. A method for fabricating a semiconductor device according to claim 1, wherein
    the step of forming the mask film comprises the steps of:
    forming the first insulation film on the semiconductor substrate;
    forming the second insulation film on the first insulation film;
    patterning the second insulation film by first dry etching under conditions for depositing a reaction product on a side wall thereof; and
    patterning the first insulation film by second dry etching using as a mask the second insulation film with the reaction product deposited on the side wall.

6. A method for fabricating a semiconductor device according to claim 5, wherein
    in the step of patterning the second insulation film by the first dry etching, an etching gas containing fluorocarbon-based gas is used.

7. A method for fabricating a semiconductor device according to claim 6, wherein
    the etching gas further contains oxygen.

8. A method for fabricating a semiconductor device according to claim 5, further comprising after the step of forming the mask film and before the step of forming the device isolation groove, the step of
    removing the reaction product deposited on the side wall of the second insulation film.

9. A method for fabricating a semiconductor device according to claim 8, wherein
    in the step of removing the reaction product, the reaction product is removed by using fluoric acid and sulfuric acid/hydrogen peroxide mixture liquid, or fluoric acid and ammonia/hydrogen peroxide mixture liquid.

10. A method for fabricating a semiconductor device according to claim 8, wherein
    in the step of removing the reaction product, the reaction product is removed by oxygen plasma processing.

11. A method for fabricating a semiconductor device according to claim 5, wherein
in the step of forming the mask film, the step of patterning the second insulation film by the first dry etching and the step of patterning the first insulation film by the second dry etching are conducted in one and the same chamber.

12. A method for fabricating a semiconductor device according to claim 5, wherein
a pressure inside a chamber where the first dry etching is conducted is 40-200 mTorr.

13. A method for fabricating a semiconductor device according to claim 1, wherein
the step of forming the mask film comprises the steps of:
forming the first insulation film on the semiconductor substrate;
forming the second insulation film on the first insulation film;
patterning the first insulation film and the second insulation film; and
decreasing the second insulation film to make a width of the second insulation film smaller than a width of the first insulation film.

14. A method for fabricating a semiconductor device according to claim 13, wherein
in the step of decreasing the second insulation film, the second insulation film is decreased by wet etching using hot phosphoric acid.

15. A method for fabricating a semiconductor device according to claim 13, wherein
in the step of decreasing the second insulation film, the second insulation film is decreased by dry etching.

16. A method for fabricating a semiconductor device according to claim 1, wherein
a film thickness of the first insulation film is above 5 nm including 5 nm and is equal to or below a distance between a side edge of the first insulation film on one side and a side edge of the second insulation film on said one side in the mask film.

17. A method for fabricating a semiconductor device according to claim 1, wherein
in the step of forming the device isolation trench, the semiconductor substrate is etched by dry etching using a mixed gas of at least one or more of hydrogen bromide gas, chlorine gas, hydrogen chloride gas and hydrogen iodide gas, and oxygen gas.

18. A method for fabricating a semiconductor device according to claim 1, wherein
the first insulation film is a silicon oxide film-based insulation film, and
the second insulation film is a silicon nitride film.

* * * * *